(12) United States Patent
Hwang et al.

(10) Patent No.: US 10,903,447 B2
(45) Date of Patent: Jan. 26, 2021

(54) DISPLAY DEVICE

(71) Applicant: SAMSUNG DISPLAY CO., LTD., Yongin-si (KR)

(72) Inventors: Hyun Min Hwang, Cheonan-si (KR); Yong Kyu Jang, Hwaseong-si (KR); Jae Kyung Go, Yongin-si (KR); Dong Jo Kim, Suwon-si (KR); Young Min Kim, Seoul (KR); Chan Young Park, Yongin-si (KR); Dong Won Han, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/943,946

(22) Filed: Jul. 30, 2020

(65) Prior Publication Data

US 2020/0358028 A1 Nov. 12, 2020

Related U.S. Application Data

(63) Continuation of application No. 16/746,480, filed on Jan. 17, 2020, now Pat. No. 10,734,604, which is a (Continued)

(30) Foreign Application Priority Data

Aug. 22, 2017 (KR) .................. 10-2017-0105883

(51) Int. Cl.
*H01L 51/52* (2006.01)
*H01L 51/56* (2006.01)
(Continued)

(52) U.S. Cl.
CPC .......... *H01L 51/5246* (2013.01); *H01L 51/56* (2013.01); *H01L 27/3276* (2013.01); *H01L 51/0096* (2013.01); *H01L 2227/323* (2013.01)

(58) Field of Classification Search
CPC . H01L 51/5246; H01L 51/56; H01L 27/3276; H01L 51/0096; H01L 2227/323
See application file for complete search history.

(56) References Cited

U.S. PATENT DOCUMENTS

| 2003/0222061 | A1 | 12/2003 | Langer et al. |
| 2009/0213319 | A1* | 8/2009 | Sasaki .................. G02F 1/1303 349/189 |

(Continued)

FOREIGN PATENT DOCUMENTS

| JP | 2003-200336 A | 7/2003 |
| KR | 10-1661278 B1 | 9/2016 |

*Primary Examiner* — Scott B Geyer
(74) *Attorney, Agent, or Firm* — Lewis Roca Rothgerber Christie LLP

(57) ABSTRACT

A display device is provided. The display device includes a display panel including first and second display substrates that face each other, having an overlap area in which the first and second display substrates overlap with each other, and having a protruding area on one side of the overlap area, a sealing member between the first and second display substrates along edges of the overlap area, and at least one chamfered portion including a first chamfered portion, which is formed on at least one side of the protruding area, and a second chamfered portion, which is formed on the overlap area and adjacent to the first chamfered portion, wherein in the second chamfered portion, an end of the first display substrate is positioned beyond an end of the second display substrate.

9 Claims, 25 Drawing Sheets

Related U.S. Application Data continuation of application No. 15/953,193, filed on Apr. 13, 2018, now Pat. No. 10,547,024.

(51) Int. Cl.
  *H01L 27/32* (2006.01)
  *H01L 51/00* (2006.01)

(56) References Cited

U.S. PATENT DOCUMENTS

| | | |
|---|---|---|
| 2010/0243156 A1 | 9/2010 | Yonemoto |
| 2011/0194063 A1 | 8/2011 | Lee et al. |
| 2013/0271710 A1* | 10/2013 | Tatemura .............. G02F 1/1339 349/110 |
| 2014/0204293 A1* | 7/2014 | Kim .................. G02F 1/133351 349/15 |
| 2015/0028317 A1 | 1/2015 | Ichihara et al. |
| 2016/0174332 A1 | 6/2016 | Shin |
| 2016/0202547 A1* | 7/2016 | Tatemura .......... G02F 1/133351 349/43 |
| 2018/0147808 A1 | 5/2018 | Kuniyasu et al. |
| 2018/0151845 A1 | 5/2018 | Jeong et al. |

* cited by examiner

DISPLAY DEVICE

CROSS-REFERENCE TO RELATED APPLICATIONS

This application is a continuation of U.S. patent application Ser. No. 16/746,480, filed Jan. 17, 2020, which is a continuation of U.S. patent application Ser. No. 15/953,193, filed Apr. 13, 2018, now U.S. Pat. No. 10,547,024, which claims priority to and the benefit of Korean Patent Application No. 10-2017-0105883, filed Aug. 22, 2017, the entire content of all of which is incorporated herein by reference.

BACKGROUND

1. Field

The present disclosure relates to a display device.

2. Description of the Related Art

An organic light-emitting display device, which is a self-emitting display device, has attracted attention as a next-generation display device because of its many advantages, such as a wide viewing angle, excellent contrast, and fast response speed.

The organic light-emitting display device includes a display panel, which displays an image and includes organic light-emitting elements and a driving circuit unit for driving the organic light-emitting elements, and a flexible circuit board, which transmits signals to the driving circuit unit.

In general, a mother panel is formed by coupling lower and upper substrates where elements for displaying an image are formed, and the display panel is formed by cutting the mother panel into a desired cell size. The cutting of the mother panel may be performed using a cutting wheel.

To reduce interference between the display panel, which is formed by cutting the mother panel, and an external cover, some of the corners of the display panel, for example, corner portions of the lower substrate that do not overlap with the upper substrate, are cut by a laser cutting process, thereby forming chamfered portions at the corner portions of the lower substrate.

Due to the laser cutting process, however, cracks or defects may be generated in the chamfered portions, and as a result, the strength of the display panel may be degraded. Thus, a process of polishing the edges of the chamfered portions to remove the cracks or defects generated in the chamfered portions is performed.

Recently, as the display area of the display panel has increased, there has been a trend in which the chamfer portions extend even to corner portions where the lower substrate and the upper substrate overlap with each other.

The polishing of portions of the lower substrate that do not overlap with the upper substrate is performed by a polishing wheel having a polishing groove with a width that is similar to the thickness of the lower substrate, and the polishing of portions in which the lower substrate and the upper substrate overlap with each other is performed by a polishing wheel having a polishing groove with a width that is similar to the sum of the thicknesses of the upper and lower substrates.

However, the polishing wheel for polishing the portions of the lower substrate that do not overlap with the upper substrate may not be able to properly perform polishing at locations near the portions in which the lower substrate and the upper substrate overlap with each other because of interference.

In this case, the portions of the lower substrate that do not overlap with the upper substrate might not be polished especially in areas near the portions in which the lower substrate and the upper substrate overlap with each other. As a result, cracks or defects may remain in the display panel.

Therefore, a polishing process capable of reducing parts of the chamfered portions that remain unpolished may be useful, and chamfered portions with fewer parts left unpolished by such polishing process may also be useful.

SUMMARY

Embodiments of the present disclosure provide a display device capable of improving the strength of a display panel by forming chamfered portions with fewer parts left unpolished so as to reduce cracks or defects.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to an embodiment of the present disclosure, a display device includes a display panel including first and second display substrates that face each other, having an overlap area in which the first and second display substrates overlap with each other, and having a protruding area on one side of the overlap area, a sealing member between the first and second display substrates along edges of the overlap area, and at least one chamfered portion including a first chamfered portion, which is formed on at least one side of the protruding area, and a second chamfered portion, which is formed on the overlap area and adjacent to the first chamfered portion, wherein in the second chamfered portion, an end of the first display substrate is positioned beyond an end of the second display substrate.

The protruding area may be defined by part of the first display substrate that does not overlap with the second display substrate.

The first and second chamfered portions may be continuous on a plane.

The chamfered portion may be inclined with respect to one side of the protruding area and has a linear or curved shape.

The first display substrate may have first top and bottom surfaces, which are parallel to each other, and a first side surface, which connects the first top surface and the first bottom surface, wherein the second display substrate has second top and bottom surfaces, which are parallel to each other, and a second side surface, which connects the second top surface and the second bottom surface, and wherein the first top surface and the second bottom surface face each other.

In the second chamfered portion, the first display substrate may have a first upper inclined surface, which is located between the first top surface and the first side surface, and a first lower inclined surface, which is located between the first bottom surface and the first side surface, and the second display substrate may have a second inclined surface, which is located between the second top surface and the second bottom surface.

In the second chamfered portion, the end of the first display substrate may be positioned on the first side surface, and the end of the second display substrate may be positioned between the second top surface and the first upper inclined surface.

A width of the second inclined surface and a width of the first lower inclined surface may be different.

A width of the second inclined surface may be smaller than a width of the first lower inclined surface, and the width of the second inclined surface may be different from a width of the first upper inclined surface.

A second inclination angle that the second top surface and the second inclined surface form with each other may be the same as a first upper inclination angle that the first top surface and the first upper inclined surface form with each other.

The first upper inclination angle may be the same as a first lower inclination angle between the first bottom surface and the first lower inclined surface.

The first upper inclination angle may be different from a first lower inclination angle between the first bottom surface and the first lower inclined surface.

The first lower inclination angle may be greater than the first upper inclination angle.

The sealing member may include frit.

According to another embodiment of the present disclosure, a display device a display panel including first and second display substrates, which are located to face each other, having an overlap area in which the first and second display substrates overlap with each other, and having a protruding area on one side of the overlap area, a sealing member between the first and second display substrates along edges of the overlap area, and at least one chamfered portion including a first chamfered portion, which is formed on at least one side of the protruding area, and a second chamfered portion, which is formed on the overlap area and adjacent to the first chamfered portion, wherein, in the second chamfered portion, the second display substrate is asymmetrical with the first display substrate with respect to the sealing member.

The protruding area may be defined by part of the first display substrate that does not overlap with the second display substrate.

The first and second chamfered portions may be continuous on a plane.

The chamfered portion may be inclined with respect to one side of the protruding area and has a linear or curved shape.

The first display substrate may have first top and bottom surfaces, which are parallel to each other, and a first side surface, which connects the first top surface and the first bottom surface, wherein the second display substrate has second top and bottom surfaces, which are parallel to each other, and a second side surface, which connects the second top surface and the second bottom surface, and wherein the first top surface and the second bottom surface face each other.

In the second chamfered portion, the first display substrate may have a first upper inclined surface, which is located between the first top surface and the first side surface, and a first lower inclined surface, which is located between the first bottom surface and the first side surface, and the second display substrate may have a second inclined surface, which is located between the second top surface and the second bottom surface.

A width of the second inclined surface and a width of the first lower inclined surface may be different from each other.

A width of the second inclined surface may be smaller than a width of the first lower inclined surface, and the width of the second inclined surface may be different from a width of the first upper inclined surface.

A second inclination angle between the second top surface and the second inclined surface may be the same as a first upper inclination angle between the first top surface and the first upper inclined surface.

The first upper inclination angle may be the same as a first lower inclination angle between the first bottom surface and the first lower inclined surface.

The first upper inclination angle may be different from a first lower inclination angle that the first bottom surface and the first lower inclined surface form with each other.

The first lower inclination angle may be greater than the first upper inclination angle.

The sealing member may include frit.

According to the aforementioned and other embodiments of the present disclosure, the strength of a display panel can be improved by reducing cracks or defects in the display panel.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

Figure 1:
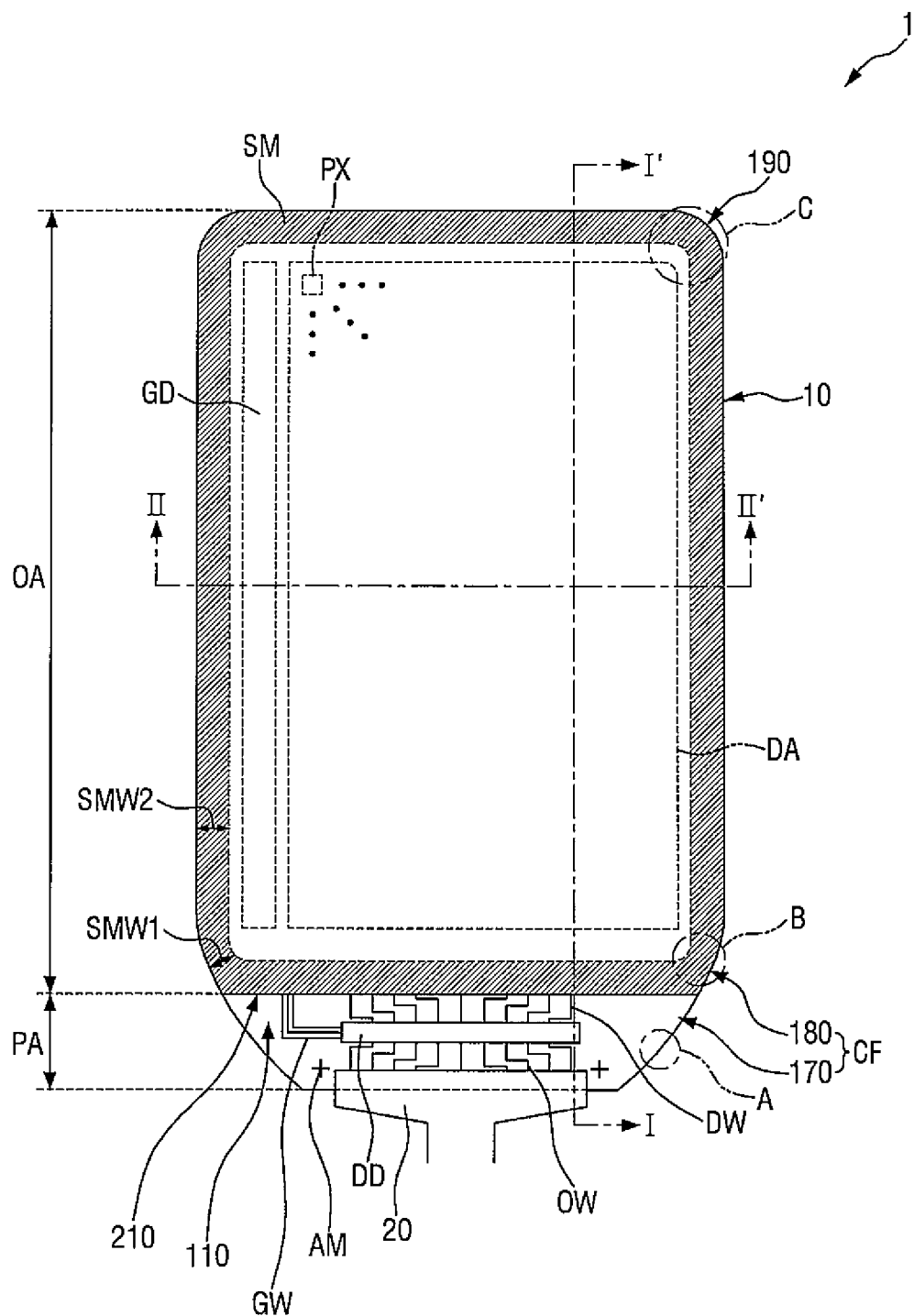
FIG. 1 is a schematic plan view of a display device according to an embodiment of the present disclosure.

Features of the inventive concept and methods of accomplishing the same may be understood more readily by reference to the following detailed description of embodiments and the accompanying drawings. Hereinafter, embodiments will be described in more detail with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
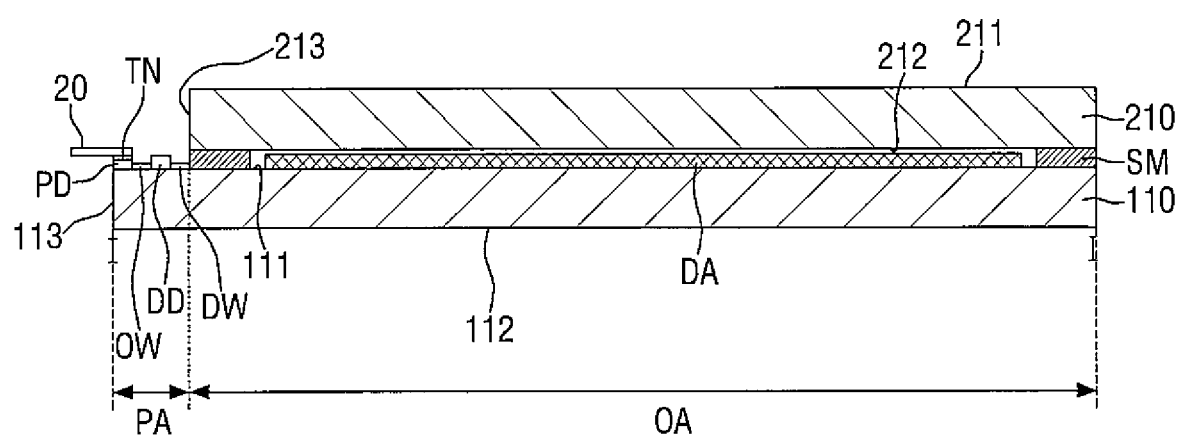
FIG. 2 is a schematic cross-sectional view taken along the line I-I' of FIG. 1.
Figure 3:
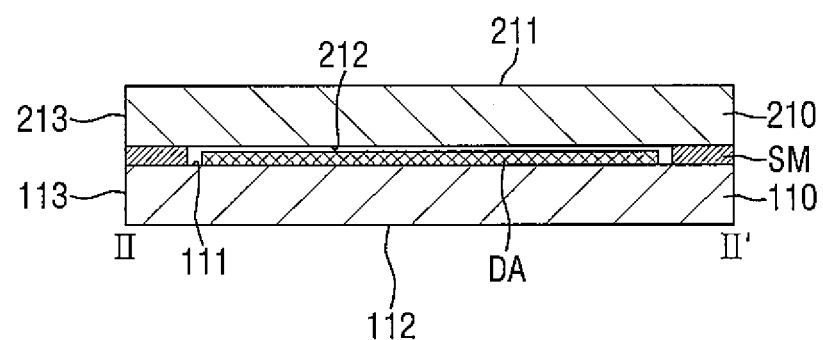
FIG. 3 is a schematic cross-sectional view taken along the line II-II' of FIG. 1.

FIG. 1 is a schematic plan view of a display device according to an embodiment of the present disclosure, FIG. 2 is a schematic cross-sectional view taken along the line I-I' of FIG. 1, and FIG. 3 is a schematic cross-sectional view taken along the line II-II' of FIG. 1.

Referring to FIGS. 1 through 3, a display device 1 includes a display panel 10, which displays an image, and a circuit board 20, which transmits driving signals and control signals for displaying the image.

The display panel 10 may be a display panel for an organic light-emitting display device or a liquid crystal display (LCD) device. In the embodiments described below, the display panel 10 is a display panel for an organic light-emitting display device.

The display panel 10 may include first and second display substrates 110 and 210, which face each other.

The display panel 10 may have an overlap area OA in which the first and second display substrates 110 and 210 overlap with each other, and a protruding area PA that is located on one side of the overlap area OA. The protruding area PA may correspond to a portion of the first display substrate 110 that does not overlap with the second display substrate 210.

Each of the first and second display substrates 110 and 210 may be formed of glass or quartz, but the present disclosure is not limited thereto. In some embodiments, each of the first and second display substrates 110 and 210 may be formed of a plastic material and may have flexibility. The first and second display substrates 110 and 210 may have the same thickness, but the present disclosure is not limited thereto.

The first display substrate 110 may have first top and bottom surfaces 111 and 112, which are parallel to each other, and a first side surface 113, which connects the first top surface 111 and the first bottom surface 112. The second display substrate 210 may include second top and bottom surfaces 211 and 212, which are parallel to each other, and a second side surface 213, which connects the second top surface 211 and the second bottom surface 212.

A sealing member SM may be located between the first and second display substrates 110 and 210. The sealing member SM may couple the first and second display substrates 110 and 210 and may be located along the edges of the overlap area OA.

The sealing member SM may comprise frit, but the present disclosure is not limited thereto. Outermost edges of the sealing member SM may coincide with outermost edges of the second display substrate 210, but the present disclosure is not limited thereto. For example, the outermost edges of the sealing member SM may be spaced (e.g., spaced by a predetermined distance) from the outermost edges of the second display substrate 210. A width SMW1 of portions of the sealing member SM that are adjacent to chamfered portions CF, which will be described later, may be smaller than a width SMW2 of the rest of the sealing member SM, as part of the sealing member SM may be cut off in areas near the chamfered portions CF during a cutting process for forming the chamfered portions CF.

The display panel 10 may include a display unit DA, which is located in the overlap area OA, and a data driving unit DD, which is located in the protruding area PA.

The display unit DA may include a plurality of pixels PX, and may display an image. The pixels PX will be described later.

A gate driving unit GD generates a gate signal, and applies the gate signal to the pixels PX via gate wiring in response to the driving signals and the control signals. Then, the pixels PX may be selected by the gate signal, and may thus be sequentially supplied with a data signal.

The gate driving unit GD may be implemented in the form of thin-film transistors (TFTs) formed on the first display substrate 110 along with the circuitry of the pixels PX, in which case the driving signals and the control signals provided by the circuit board 20 may be transmitted to the gate driving unit GD via gate connecting wiring GW. In some embodiments, the gate driving unit GD may be formed as a chip-on-glass (COG) structure, a tape carrier package (TCP) structure, or a chip-on-film (COF) structure.

An emission control driving unit may be located in the overlap area OA. The emission control driving unit may sequentially apply an emission control signal to emission control wiring, which may be located in parallel to the gate wiring, in response to the driving signals and the control signals provided by the circuit board 20. Then, the emission of light in the pixels PX is controlled by the emission control signal.

The data driving unit DD generates a data signal in response to the driving signals and the control signals provided by the circuit board 20, and applies the data signal to the pixels PX via data wiring DW. Then, the pixels PX are respectively charged with a voltage corresponding to the data signal.

The data driving unit DD may be formed as a COG structure. In some embodiments, the data driving unit DD may be formed as a TCP structure or a COF structure.

The circuit board 20 may be configured to transmit driving signals and control signals to the display panel 10, and may include a terminal TN that is connected to a pad PD located in the protruding area PA. The circuit board 20 may be a flexible printed circuit board (FPCB).

Referring to FIGS. 1 and 2, "OW" refers to wiring for transmitting the driving signals and control signals provided by the circuit board 20 to the driving unit DD, and "AM" refers to an alignment mark for aligning the terminal TN over the pad PD in the protruding area PA.

The display panel 10 includes chamfered portions CF, and each of the chamfered portions CF includes a first chamfered portion 170, which is formed on at least one side of the protruding area PA, and a second chamfered portion 180, which is formed in the overlap area OA to be adjacent to the first chamfered portion 170. The first and second chamfered portions 170 and 180 of the chamfered portions CF may be continuous on a plane, and each of the chamfered portions CF may be inclined with respect to one side of the protruding area PA and may have a curved shape.

The chamfered portions CF are formed by chamfering the corners of the display panel 10 using a laser to reduce interference during the coupling of the display panel 10 and an external cover. The chamfered portions CF may further include a third chamfered portion 190, which is formed in the overlap area OA at a corner of the overlap region OA that is spaced apart from the first chamfered portion 170. The third chamfered portion 190 may provide a naturally curved shape as a design feature. In other embodiments, the third chamfered portion 190 may be omitted. The chamfered portions CF will be described later in further detail.

The structure of the pixels PX will hereinafter be described.

Figure 4:
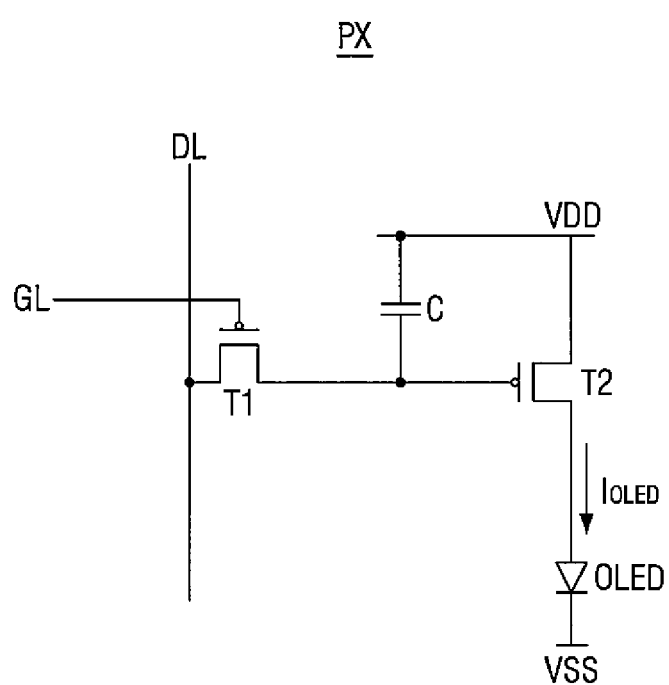
FIG. 4 is a circuit diagram of a pixel of FIG. 1.
Figure 5:
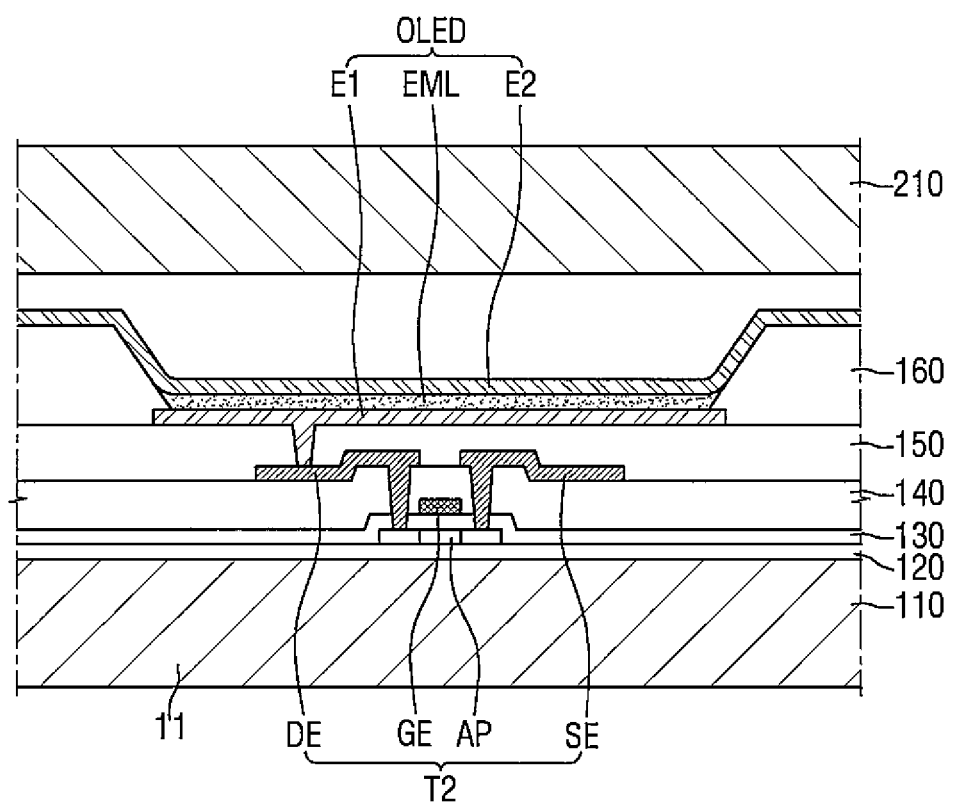
FIG. 5 is a cross-sectional view of a pixel of FIG. 1.

FIG. 4 is a circuit diagram of a pixel of FIG. 1, and FIG. 5 is a cross-sectional view of a pixel of FIG. 1.

Referring to FIG. 4, a pixel PX may include two or more TFTs (T1 and T2), at least one capacitor C, and an organic light-emitting element OLED. The circuitry of the pixel PX of FIG. 2 is merely an example, and thus, the present disclosure is not limited thereto.

The TFTs (T1 and T2) include a first TFT T1 and a second TFT T2.

The first TFT T1 is connected to a gate line GL and a data line DL. The first TFT T1 is switched on by a gate signal applied to the gate line GL and thus provides a data voltage applied to the data line DL to the second TFT T2.

The second TFT T2 is switched on by the data voltage provided by the first TFT T1 and thus controls an output current IOLED that flows to the organic light-emitting element OLED by a driving voltage VDD.

The capacitor C is connected between the gate electrode and the source electrode of the second TFT T2, stores a voltage corresponding to the data voltage provided to the gate electrode of the second TFT T2, and turns on the second TFT T2 with the stored voltage.

The organic light-emitting element OLED is electrically connected between the drain electrode of the second TFT T2 and a power source to which a common voltage VSS is applied, and emits light according to the output current IOLED, which is provided by the second TFT T2.

The pixel PX may control the output current IOLED, which flows to the organic light-emitting element OLED due to the driving voltage VDD, through the switching on or off of, or the control of, the second TFT T2, and may thus allow the organic light-emitting element OLED to emit light to display an image.

The structure of the organic light-emitting element OLED and the structure of the second TFT T2, which provides the output current IOLED to the organic light-emitting element OLED, will hereinafter be described with reference to FIG. 5.

Referring to FIG. 5, the second TFT T2 includes a semiconductor pattern AP, a gate electrode GE, a source electrode SE, and a drain electrode DE.

The second TFT T2 receives a data voltage for allowing the organic light-emitting element OLED to emit light, and applies the data voltage to a first electrode E1 of the organic light-emitting element OLED via the source electrode SE, the semiconductor pattern AP, and the drain electrode DE. The first electrode E1 and the drain electrode DE may be connected to each other.

The semiconductor pattern AP may be located on a buffer layer 120, which is located on the first display substrate 110, a first interlayer insulating layer 130 may be located between the semiconductor pattern AP and the gate electrode GE, a second interlayer insulating layer 140 may be located between the gate electrode GE and the source electrode SE and the drain electrode DE, a planarization layer 150 may be located between the first electrode E1 and the source electrode SE and the drain electrode DE, and a pixel-defining film 160, which exposes the first electrode E1, may be located on the planarization layer 150.

The organic light-emitting element OLED includes the first electrode E1, an organic emission layer EML, which is located on the first electrode E1, and a second electrode E2, which is located on the organic emission layer EML.

The first electrode E1 may be an anode electrode, which is a hole injection electrode, and the second electrode E2 may be a cathode electrode, which is an electron injection electrode. If the data voltage is provided to the first electrode E1 by the second TFT T2, and if the common voltage (VSS of FIG. 4) is provided to the second electrode E2, holes from the first electrode E1 and electrons from the second electrode E2 may be injected into the organic emission layer EML, and the organic emission layer EML may emit light in response to the transition of excitons, which are formed by recombining the holes and the electrons, from an excited state to a base state.

The chamfered portions CF, which are formed by chamfering corners of the display panel 10, will hereinafter be described.

Figure 6:
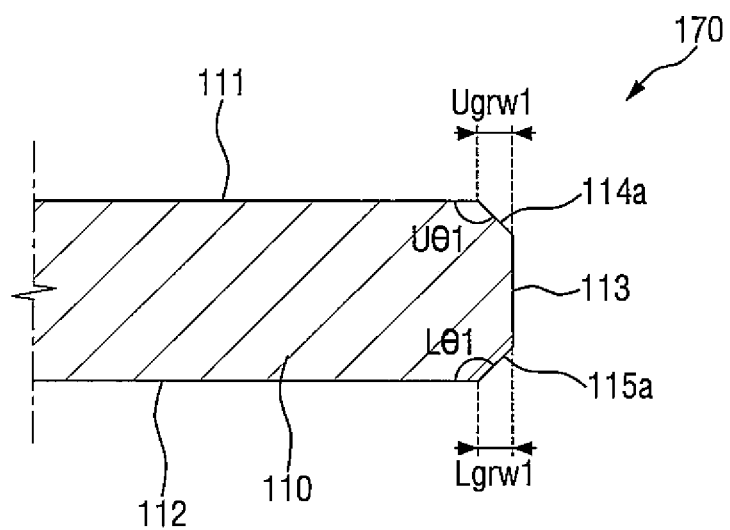
FIG. 6 is an enlarged cross-sectional view of an area A of FIG. 1.
Figure 7:
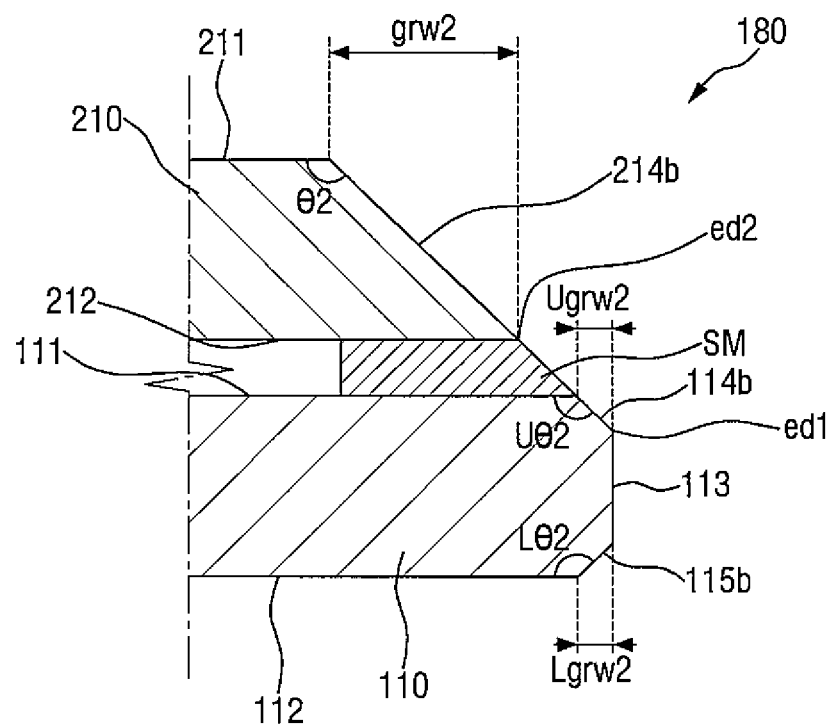
FIG. 7 is an enlarged cross-sectional view of an area B of FIG. 1.
Figure 8:
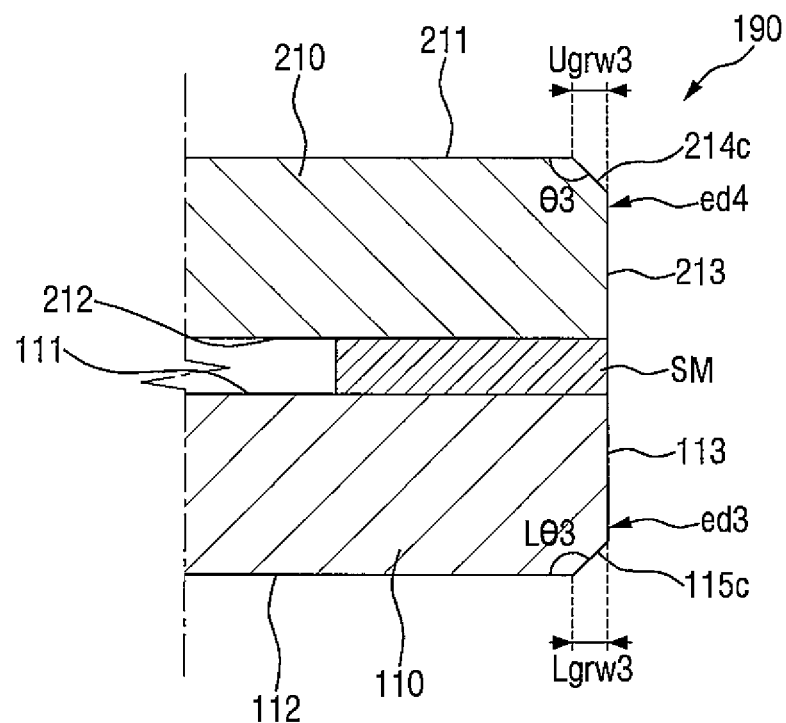
FIG. 8 is an enlarged cross-sectional view of an area C of FIG. 1.

FIG. 6 is an enlarged cross-sectional view of an area A of FIG. 1, FIG. 7 is an enlarged cross-sectional view of an area B of FIG. 1, and FIG. 8 is an enlarged cross-sectional view of an area C of FIG. 1.

Referring to FIG. 1 and FIG. 6, as mentioned above, a first chamfered portion 170 may be formed on at least one side of the protruding area PA of the display panel 10. The first chamfered portion 170, which is a portion cut by a laser, is polished by a polishing process using a polishing wheel (e.g., polishing wheel 300 of FIG. 18) to remove cracks or defects in the first chamfered portion 170.

As a result of the polishing process, in the first chamfered portion 170, a first upper inclined surface 114a may be formed between the first top surface 111 and the first side surface 113 of the first display substrate 110, and a first lower inclined surface 115a may be formed between the first bottom surface 112 and the first side surface 113 of the first display substrate 110.

A first upper inclination angle $U\theta1$ that the first top surface 111 and the first upper inclined surface 114a form with each other may be the same as a first lower inclination angle $L\theta1$ that the first bottom surface 112 and the first lower inclined surface 115a form with each other.

A width Ugrw1 of the first upper inclined surface 114a (e.g., a width in a plan view) may be the same as a width Lgrw1 of the first lower inclined surface 115a (e.g., a width in a plan view). The width Ugrw1 of the first upper inclined surface 114a may be defined as a horizontal distance between the end of the first top surface 111 and the first side surface 113 after the polishing process that is used to polish the first chamfered portion 170, and the width Lgrw1 of the first lower inclined surface 115a may be defined as a horizontal distance from the end of the first bottom surface 112 to the first side surface 113 after the polishing process used to polish the first chamfered portion 170.

Referring to FIG. 1 and FIG. 7, as mentioned above, a second chamfered portion 180 may be formed in the overlap area OA of the display panel 10, and may be located adjacent to the first chamfered portion 170. The second chamfered portion 180, which is a portion cut by a laser, is polished, together with the first chamfered portion 170, by a polishing process using the polishing wheel (e.g., polishing wheel 300 of FIG. 18), which may also be used to polish the first chamfered portion 170 to remove cracks or defects in the second chamfered portion 180.

As a result of the polishing process, in the second chamfered portion 180, a first upper inclined surface 114b may be formed between the first top surface 111 and the first side surface 113 of the first display substrate 110, and a first lower inclined surface 115b may be formed between the first bottom surface 112 and the first side surface 113 of the first display substrate 110. Also, in the second chamfered portion 180, a second inclined surface 214b may be formed between the second top surface 211 and the second bottom surface 212 of the second display substrate 210.

In the second chamfered portion 180, an end ed1 of the first display substrate 110 may be positioned outside an end ed2 of the second display substrate 210. The end ed1 of the first display substrate 110 may be positioned on the first side surface 113, and the end ed2 of the second display substrate 210 may be positioned between the second top surface 211 and the first upper inclined surface 114b. Also, in the second chamfered portion 180, the second display substrate 210 may be asymmetrical with the first display substrate 110 with respect to the sealing member SM.

A first upper inclination angle $U\theta2$ that the first top surface 111 and the first upper inclined surface 114b form with each other, a first lower inclination angle $L\theta2$ that the first bottom surface 112 and the first lower inclined surface 115b form with each other, and a second inclination angle $\theta2$ that the second top surface 211 and the second inclined surface 214b form with each other may all be identical or similar.

A width Ugrw2 of the first upper inclined surface 114b may be the same as a width Lgrw2 of the first lower inclined surface 115b (e.g., in a plan view), and a width grw2 of the second inclined surface 214b may be different from the width Lgrw2 of the first lower inclined surface 115b. For example, the width grw2 of the second inclined surface 214b may be greater than the width Lgrw2 of the first lower inclined surface 115b. The width grw2 of the second inclined surface 214b may be defined as the horizontal distance from the end of the second top surface 211 and the end of the second bottom surface 212/end ed2 of the second display substrate 210 after the polishing process used to polish the second chamfered portion 180. The difference between the width grw2 of the second inclined surface 214b and the width Lgrw2 of the first lower inclined surface 115b may vary depending on the structure of a polishing groove in the polishing wheel used to polish the second chamfered portion 180.

Referring to FIG. 1 and FIG. 8, as mentioned above, a third chamfered portion 190 may be formed in the overlap area OA of the display panel 10 at a corner spaced apart from the first chamfered portion 170. The third chamfered portion 190, which is a portion cut by a laser, is polished by a polishing process using a polishing wheel to remove cracks or defects in the third chamfered portion 190. A polishing groove of the polishing wheel may have the same maximum width as the sum of the thicknesses of the first and second display substrates 110 and 210.

As a result of the polishing process, in the third chamfered portion 190, a first lower inclined surface 115c may be formed between the first bottom surface 112 and the first side surface 113 of the first display substrate 110, and a second inclined surface 214c may be formed between the second top surface 211 and the second side surface 213 of the second display substrate 210.

In the third chamfered portion 190, an end ed3 of the first display substrate 110 may on a same vertical line as an end ed4 of the second display substrate 210. The end ed3 of the first display substrate 110 may be positioned on the first side surface 113, and the end ed4 of the second display substrate 210 may be positioned on the second side surface 213. Also, in the third chamfered portion 190, the second display substrate 210 may be symmetrical with the first display substrate 110 with respect to the sealing member SM.

A first lower inclination angle $L\theta3$ that the first bottom surface 112 and the first lower inclined surface 115c form with each other may be the same as a second inclination angle $\theta3$ that the second top surface 211 and the second inclined surface 214c form with each other.

A width Lgrw3 of the first lower inclined surface 115c may be the same as a width Ugrw3 of the second inclined surface 214c (e.g., a horizontal width in a plan view).

Figure 18:
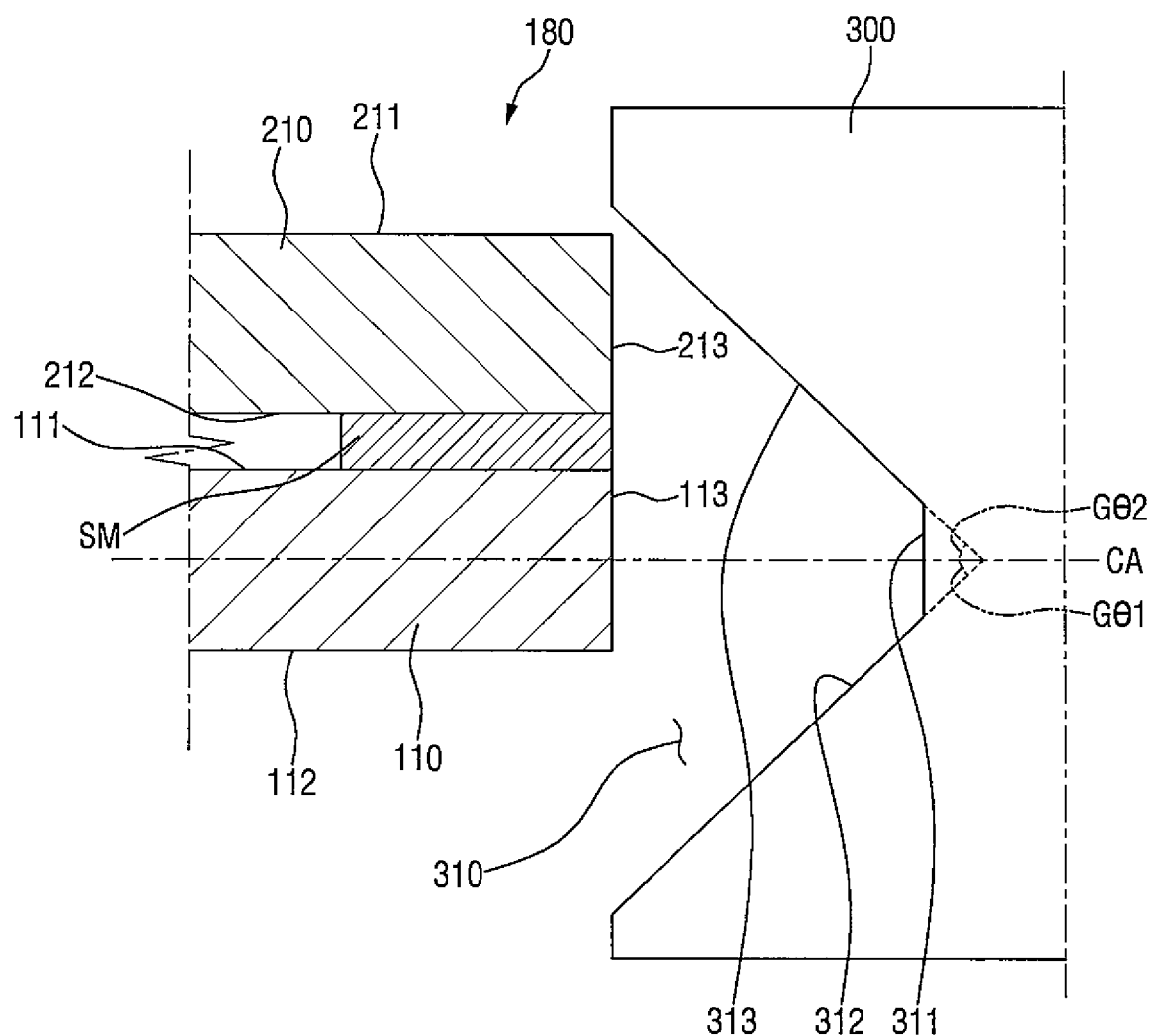

In short, the display device 1 may include first and second chamfered portions 170 and 180, which may all be polished by a polishing wheel (e.g., polishing wheel 300 of FIG. 18) having a polishing groove (e.g., polishing groove 310 of FIG. 18).

Accordingly, portions of the first chamfered portions 170 that remain unpolished can be reduced including in areas near the second chamfered portions 180, and as a result, cracks or defects in the display panel 10 can be reduced. Therefore, the strength of the display panel 10 can be improved.

Various embodiments of chamfered portions will hereinafter be described.

FIGS. 9 through 16 are schematic views illustrating various exemplary chamfered portions.

Figure 9:
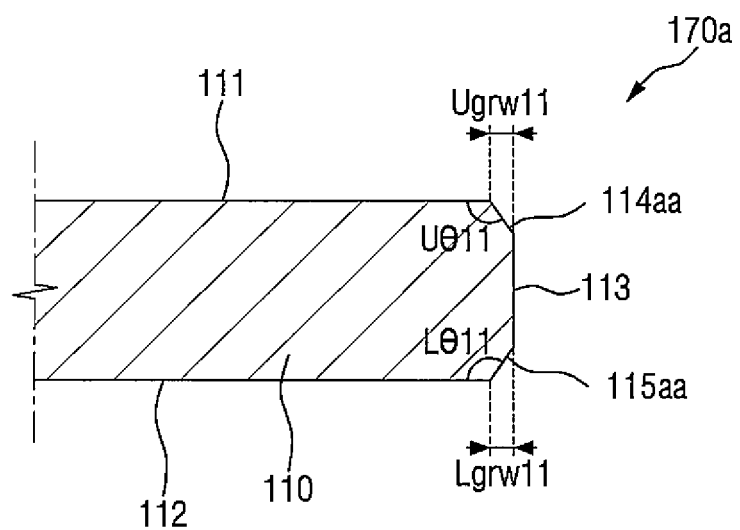
FIGS. 9 through 16 are schematic views illustrating various exemplary chamfered portions.
Figure 10:
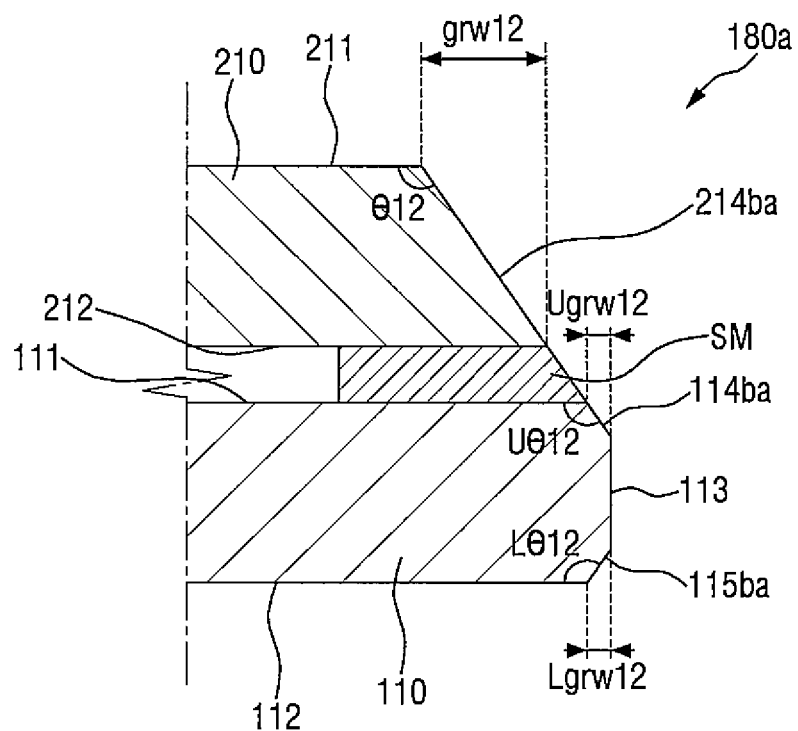

Referring to FIGS. 9 and 10, chamfered portions may include first and second chamfered portions 170a and 180a.

FIG. 9 illustrates an example in which in the first chamfered portion 170a, a first upper inclination angle U$\theta$11 is the same as a first lower inclination angle L$\theta$11. In the present embodiment, a width Ugrw11 of a first upper inclined surface 114aa and a width Lgrw11 of a first lower inclined surface 115aa are smaller than the width Ugrw1 of the first upper inclined surface 114a of FIG. 6 and the width Lgrw1 of the first lower inclined surface 115a of FIG. 6, respectively.

FIG. 10 illustrates an example in which (in the second chamfered portion 180a) a second inclination angle $\theta$12, a first lower inclination angle L$\theta$12, and a first upper inclination angle U$\theta$12 are all identical, and a width Ugrw12 of a first upper inclined surface 114ba and a width Lgrw12 of a first lower inclined surface 115ba are smaller than the width Ugrw2 of the first upper inclined surface 114b of FIG. 7 and the width Lgrw2 of the first lower inclined surface 115b of FIG. 7, respectively. The first and second chamfered portions 170a and 180a may be formed using a polishing wheel 400 of FIG. 21.

A width grw12 of a second inclined surface 214ba of the second chamfered portion 180a is smaller than the width grw2 of the second inclined surface 214b of the second chamfered portion 180 of FIG. 7. This means that not only the amount by which a sealing member SM is peeled off, or a degree to which the sealing member SM is removed, during the polishing of the second chamfered portion 180a, but also the amount of noise generated during the polishing of the second chamfered portion 180a, is reduced.

That is, the chamfered portion of FIGS. 9 and 10 can reduce the degradation due to the coupling force between first and second display substrates 110 and 210 by the sealing member SM.

Figure 11:
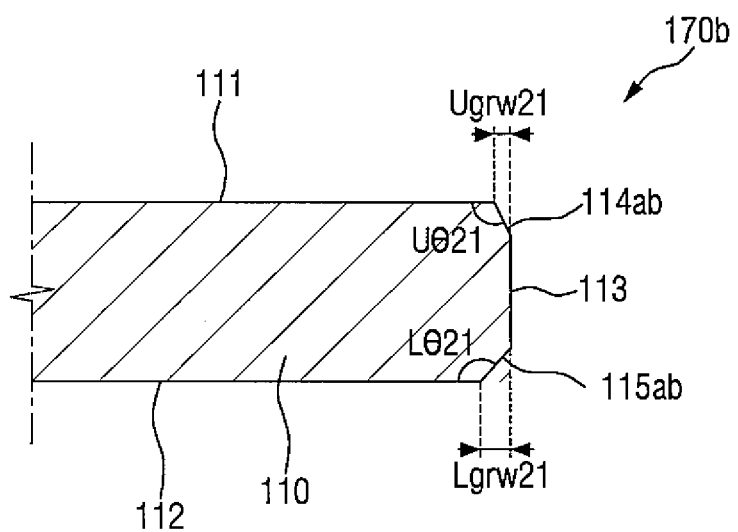
Figure 12:
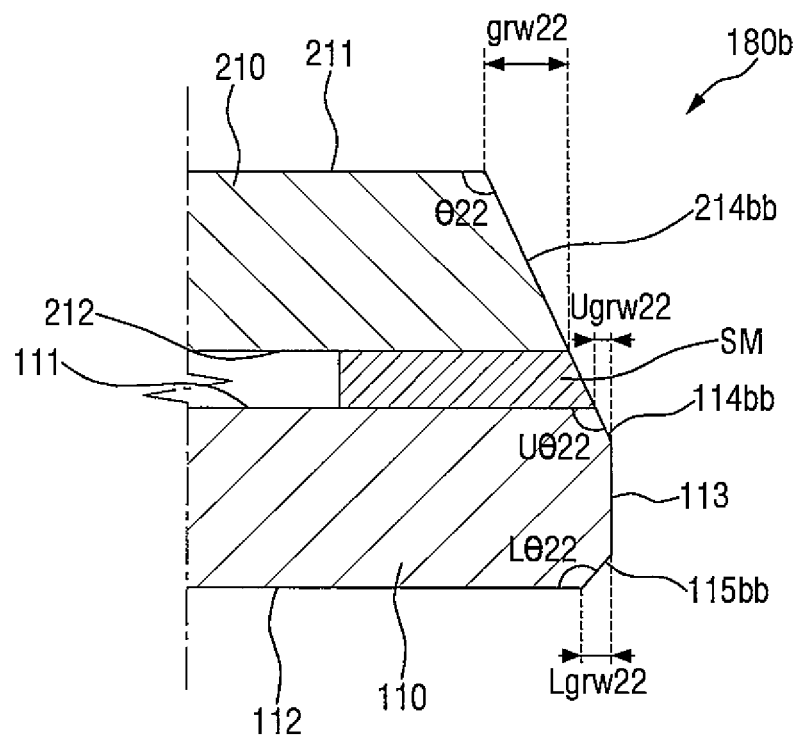

Referring to FIGS. 11 and 12, a chamfered portion may include first and second chamfered portions 170b and 180b.

FIG. 11 illustrates an example in which in the first chamfered portion 170b, a first upper inclination angle U$\theta$21 and a first lower inclination angle L$\theta$21 are different from each other, and a width Ugrw21 of a first upper inclined surface 114ab and a width Lgrw21 of a first lower inclined surface 115ab are different from each other.

For example, the first lower inclination angle L$\theta$21 may be greater than the first upper inclination angle U$\theta$21. Further, for example, the width Lgrw21 of the first lower inclined surface 115ab may be greater than the width Ugrw21 of the first upper inclined surface 114ab (e.g., in a plan view).

FIG. 12 illustrates an example in which (in the second chamfered portion 180b) a second inclination angle $\theta$22 is the same as the first upper inclination angle U$\theta$22 and is different from the first lower inclination angle L$\theta$22, a width Ugrw22 of a first upper inclined surface 114bb is different from a width Lgrw22 of a first lower inclined surface 115bb, and a width grw22 of a second inclined surface 214bb is smaller than the width grw12 of the second inclined surface 214ba of FIG. 10.

For example, the first lower inclination angle L$\theta$22 may be greater than the second inclination angle $\theta$22. Further, for example, the width Lgrw22 of the first lower inclined surface 115bb may be greater than the width Ugrw22 of the first upper inclined surface 114bb (e.g., in a plan view).

Figure 23:
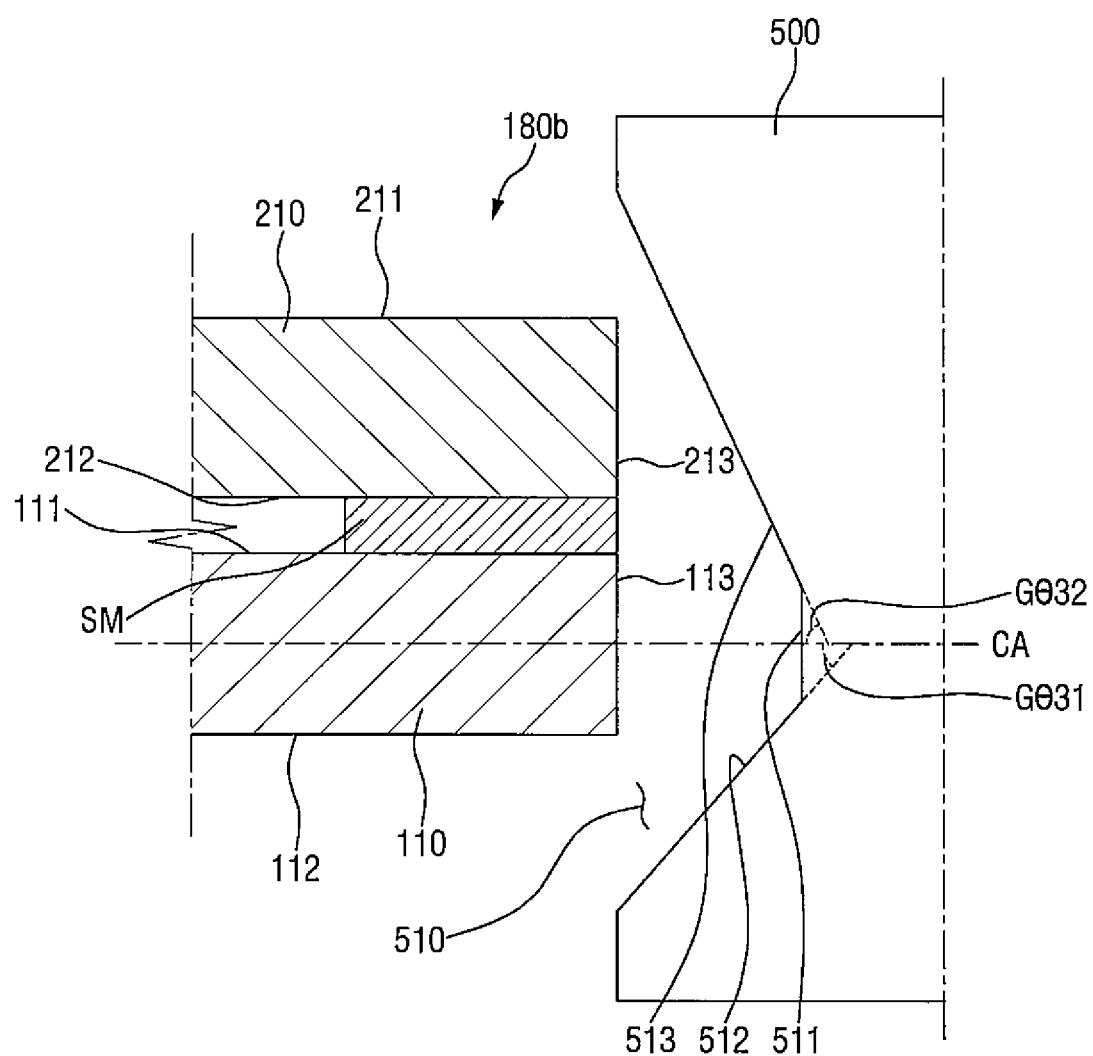

The first and second chamfered portions 170b and 180b may be formed using a polishing wheel 500 of FIG. 23.

A width grw22 of the second inclined surface 214bb of the second chamfered portion 180b of the present embodiment is smaller than the width grw12 of the second inclined surface 214ba of the second chamfered portion 180a of FIG. 10. This means that not only the amount by which a sealing member SM is removed or peeled off during the polishing of the second chamfered portion 180b, but also the amount of noise generated during the polishing of the second chamfered portion 180b, is further reduced.

That is, the chamfered portion of FIGS. 11 and 12 can further reduce the degradation of the coupling force between first and second display substrates 110 and 210 due to the sealing member SM.

Figure 13:
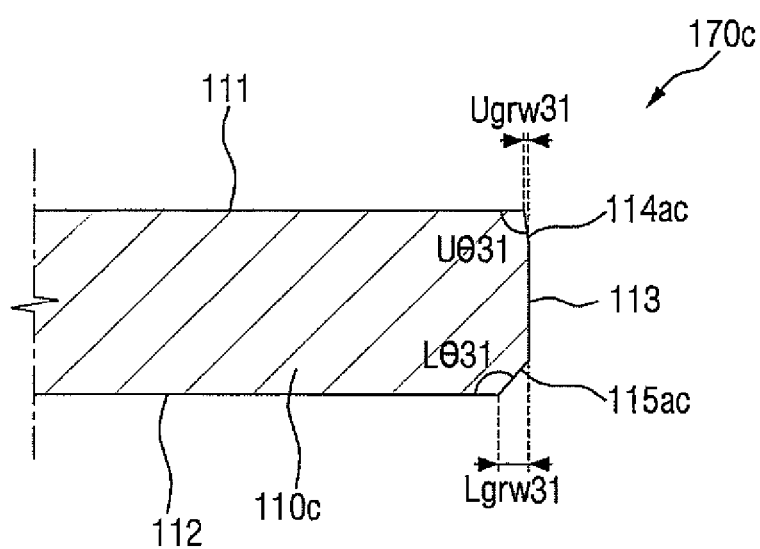
Figure 14:
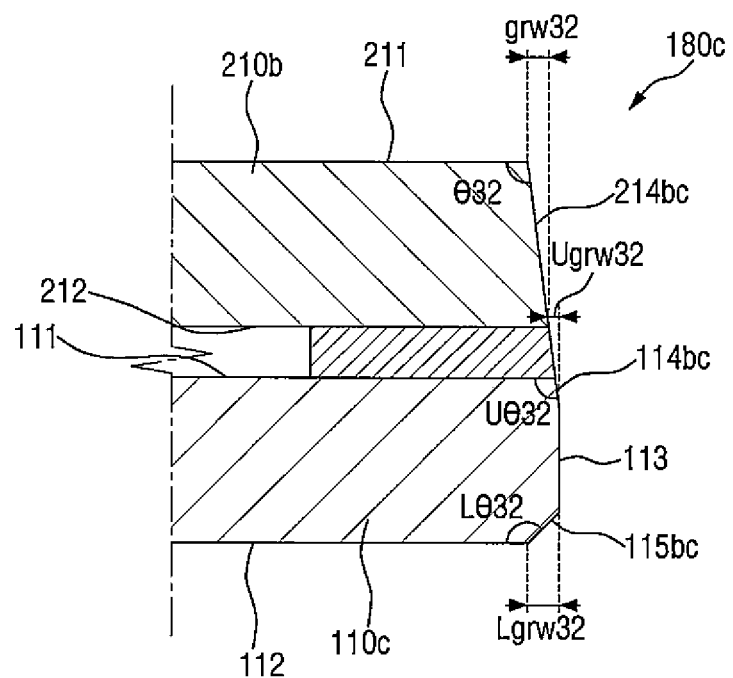

Referring to FIGS. 13 and 14, a chamfered portion may include first and second chamfered portions 170c and 180c.

FIG. 13 illustrates an example in which (in the first chamfered portion 170c) a first upper inclination angle U$\theta$31 and a first lower inclination angle L$\theta$31 are different from each other, and a width Ugrw31 of a first upper inclined surface 114ac and a width Lgrw31 of a first lower inclined surface 115ac are different from each other.

For example, the first lower inclination angle L$\theta$31 may be greater than the first upper inclination angle U$\theta$31, and the width Lgrw31 of the first lower inclined surface 115ac may be greater than the width Ugrw31 of the first upper inclined surface 114ac.

FIG. 14 illustrates an example in which (in the second chamfered portion 180c) a second inclination angle $\theta$32 is the same as the first upper inclination angle U$\theta$32 but is different from the first lower inclination angle L$\theta$32. Further, a width Ugrw32 of a first upper inclined surface 214bc is different from a width Lgrw32 of a first lower inclined surface 115bc, and a width grw32 of a second inclined surface 214bc is smaller than the width Lgrw32 of the first lower inclined surface 115bc, and is also smaller than the width grw22 of the second inclined surface 214bb of FIG. 12.

For example, the first lower inclination angle L$\theta$32 may be greater than the second inclination angle $\theta$32, and the width Lgrw32 of the first lower inclined surface 115bc may be greater than the width Ugrw32 of the first upper inclined surface 114bc.

Figure 25:
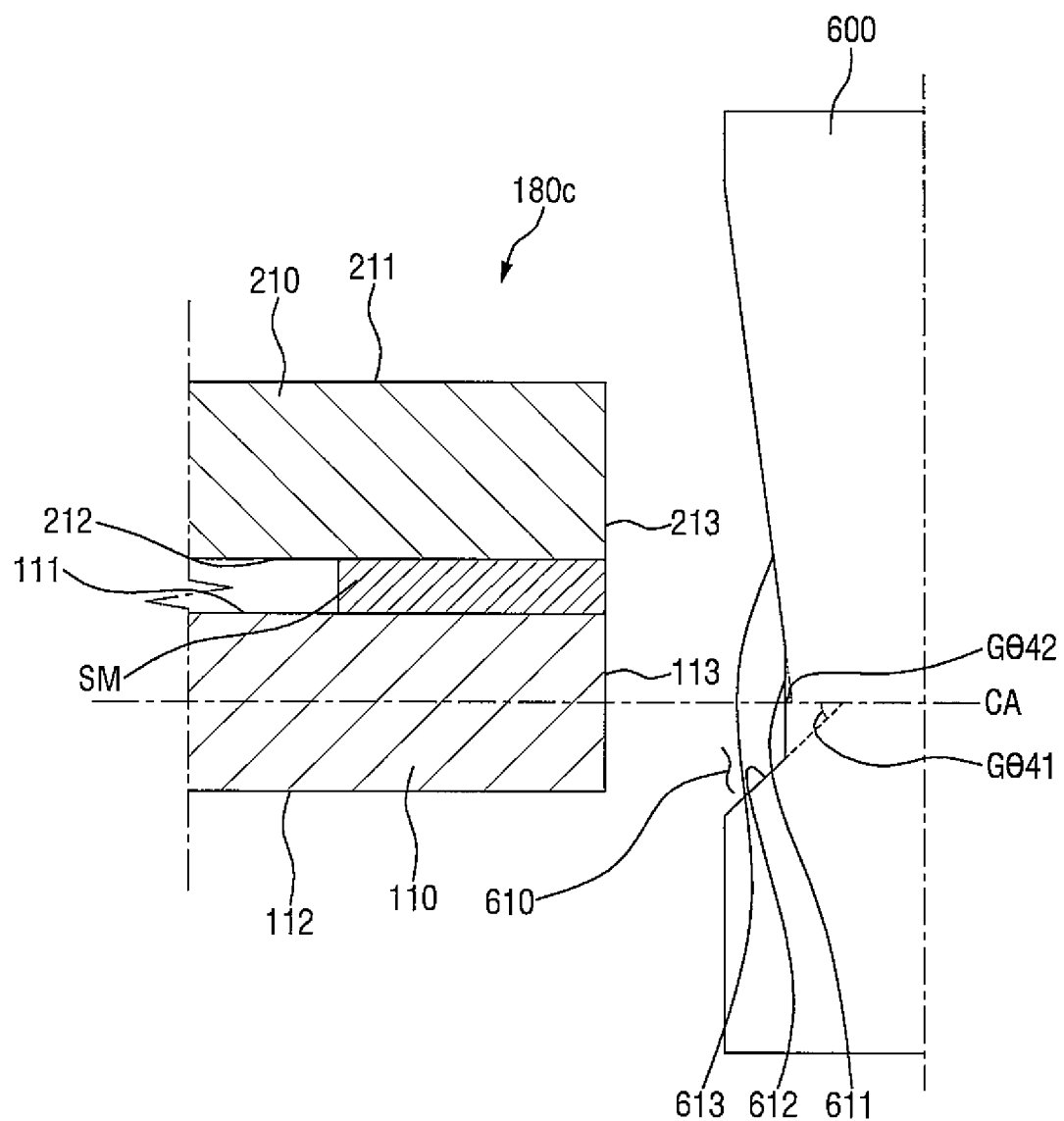

The first and second chamfered portions 170c and 180c may be formed using a polishing wheel 600 of FIG. 25.

A width grw32 of the second inclined surface 214bc of the second chamfered portion 180c is smaller than the width grw22 of the second inclined surface 214bb of the second chamfered portion 180b of FIG. 12. This means that, not only the amount by which a sealing member SM is peeled or polished off during the polishing of the second chamfered portion 180c, but also the amount of noise generated during the polishing of the second chamfered portion 180c, is further reduced.

Accordingly, the chamfered portion of FIGS. 13 and 14 can further reduce the degradation of the coupling force between first and second display substrates 110 and 210 by the sealing member SM.

Figure 15:
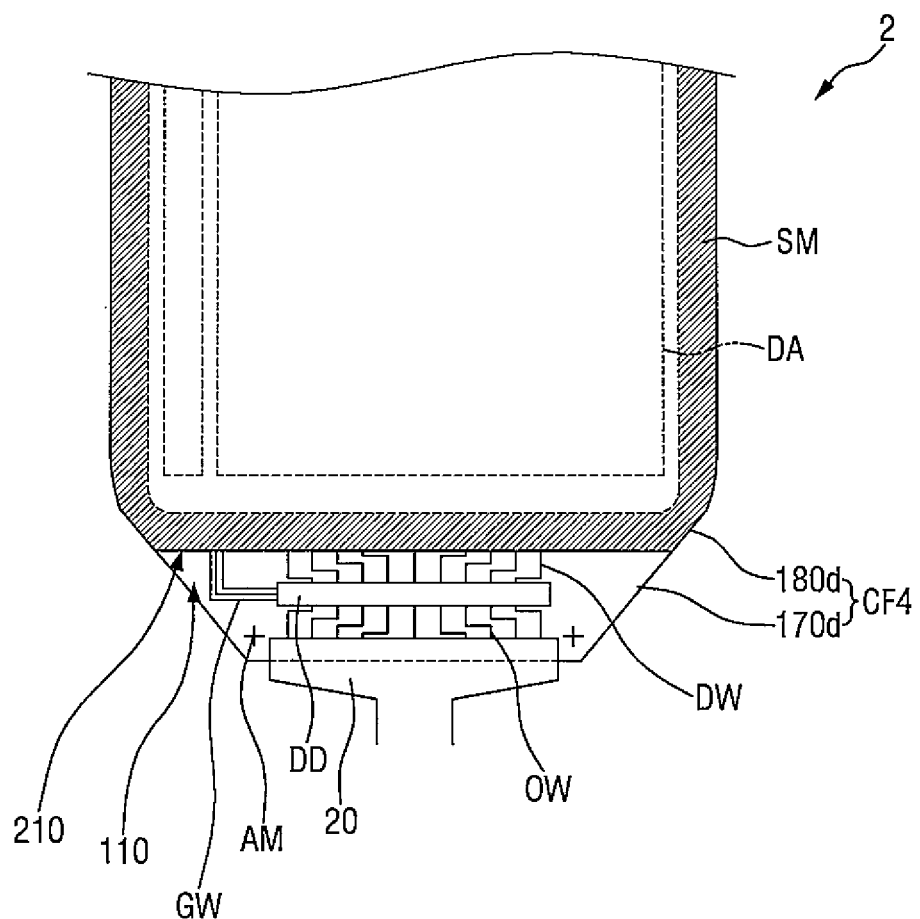

FIG. 15 illustrates a display device 2 in which chamfered portions CF4, which include first and second chamfered portions 170d and 180d, are inclined with respect to sides of a protruding area (e.g., protruding area PA of FIG. 1) on a plane and have a linear shape.

The chamfered portions CF4 may be applicable to the above-mentioned embodiments of FIGS. 1 through 14.

Figure 16:
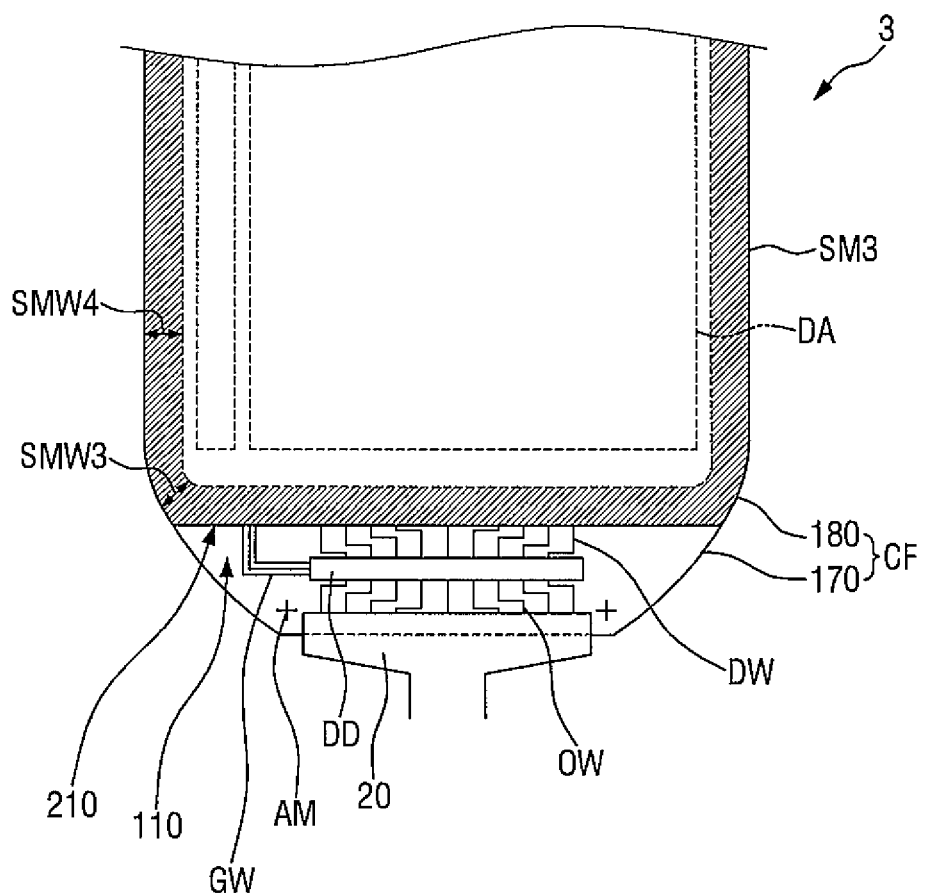

FIG. 16 illustrates a display device 3 in which a width SMW3 of part of a sealing member SM3 near a second chamfered portion 180 of each chamfered portion CF is the same as a width SMW4 of the rest of the sealing member SM3.

The sealing member SM3 may be applicable to the above-mentioned embodiments of FIGS. 1 through 15.

The polishing of chamfered portions as performed in a manufacturing method of a display device according to an embodiment of the present disclosure will hereinafter be described.

FIGS. 17 through 20 include schematic and cross-sectional views illustrating the polishing of chamfered portions as performed in a manufacturing method of a display device according to an embodiment of the present disclosure.

Figure 17:
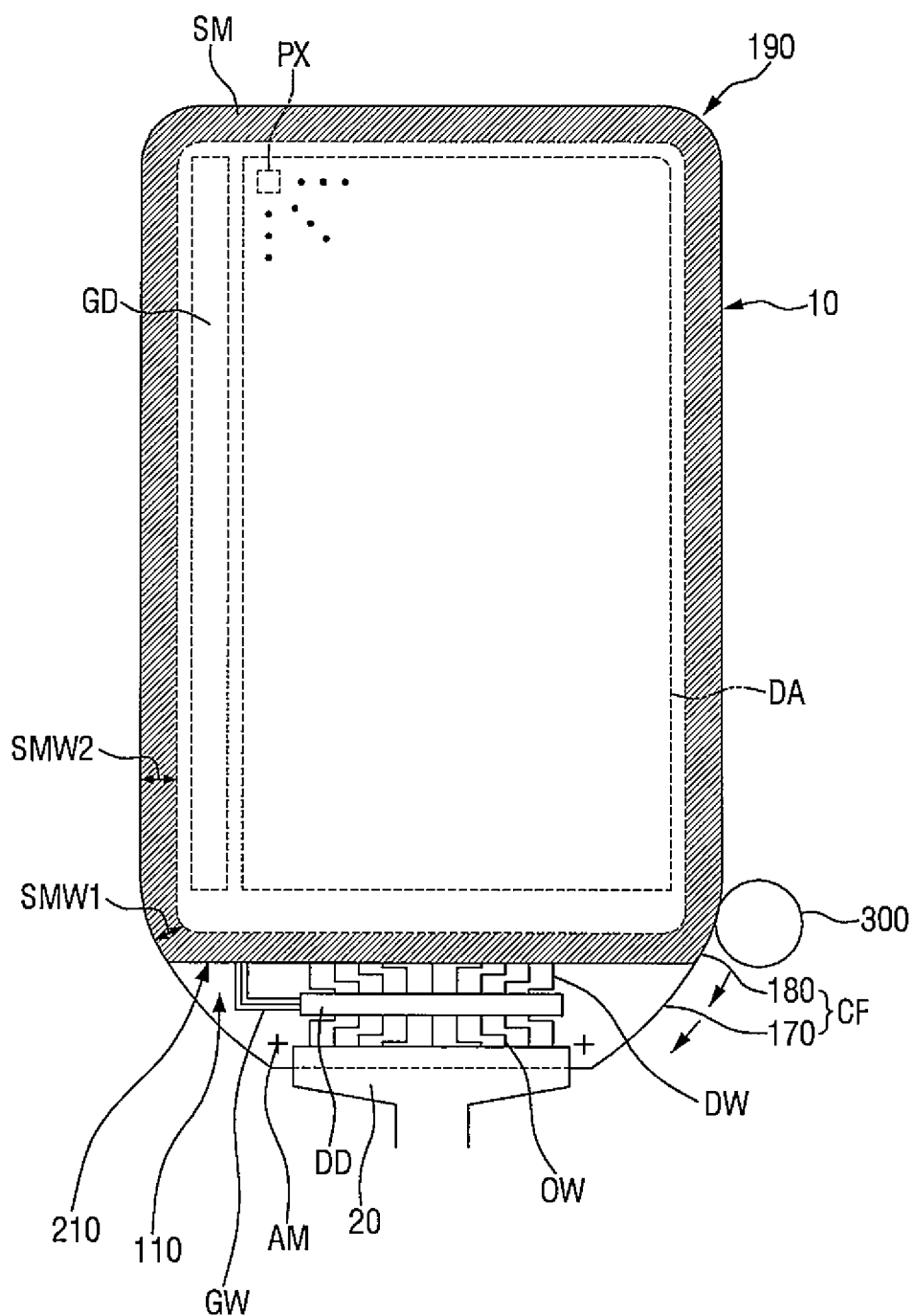
FIGS. 17 through 20 include schematic and cross-sectional views illustrating the polishing of chamfered portions as performed in a manufacturing method of a display device according to an embodiment of the present disclosure.

Referring to FIG. 17, a display panel 10, which includes first and second display substrates 110 and 210 bonded by a sealing member SM, is prepared. The display panel 10 has chamfered portions CF, which includes first and second chamfered portions 170 and 180 that are formed by a laser cutting process. The display panel 10 has already been described above, and thus, a repeated detailed description thereof will be omitted.

Thereafter, a polishing wheel 300 faces each of the chamfered portions CF. The polishing of each of the chamfered portions CF using the polishing wheel 300 may be performed in a direction from the second chamfered portion 180 to the first chamfered portion 170, but the present disclosure is not limited thereto. That is, alternatively, the polishing of each of the chamfered portions CF using the polishing wheel 300 may be performed in a direction from the first chamfered portion 170 to the second chamfered portion 180. The polishing of each of the chamfered portions CF using the polishing wheel 300 will hereinafter be described as being performed in the direction from the second chamfered portion 180 to the first chamfered portion 170.

Referring to FIG. 18, the polishing wheel 300 faces a second chamfered portion 180. Inclined surfaces are yet to be formed on the second chamfered portion 180.

The polishing wheel 300 includes a polishing groove 310 for polishing, and the surface of the polishing groove 310 may be diamond-studded. The polishing wheel 300 rotates about a vertical axis of rotation and is configured to be commonly used for polishing both the first and second chamfered portions 170 and 180. In this case, part of the first chamfered portion 170 that remains unpolished can be reduced especially in an area near the second chamfered portion 180.

The polishing groove 310 has an inner side surface 311, a first inner inclined surface 312, which is connected to the inner side surface 311 below the inner side surface 311, and a second inner inclined surface 313, which is connected to the inner side surface 311 above the inner side surface 311.

The polishing groove 310 of the polishing wheel 300 is aligned in such a manner that the center of the inner side surface 311 can coincide with the center between a first top surface 111 and a first bottom surface 112 of the first display substrate 110 when the polishing groove 310 of the polishing wheel 300 faces the second chamfered portion 180. A first angle G$\theta$1 that a horizontal axis CA (which is formed by the alignment of the polishing groove 310 of the polishing wheel 300) and the first inner inclined surface 312 form with each other may be the same as a second angle G$\theta$2 that the horizontal axis CA and the second inner inclined surface 313 form with each other.

The maximum width between the first and second inner inclined surfaces 312 and 313 of the polishing groove 310 may be greater than the thickness between the first bottom surface 112 of the first display substrate 110 and the second top surface 211 of the second display substrate 210.

Figure 19:
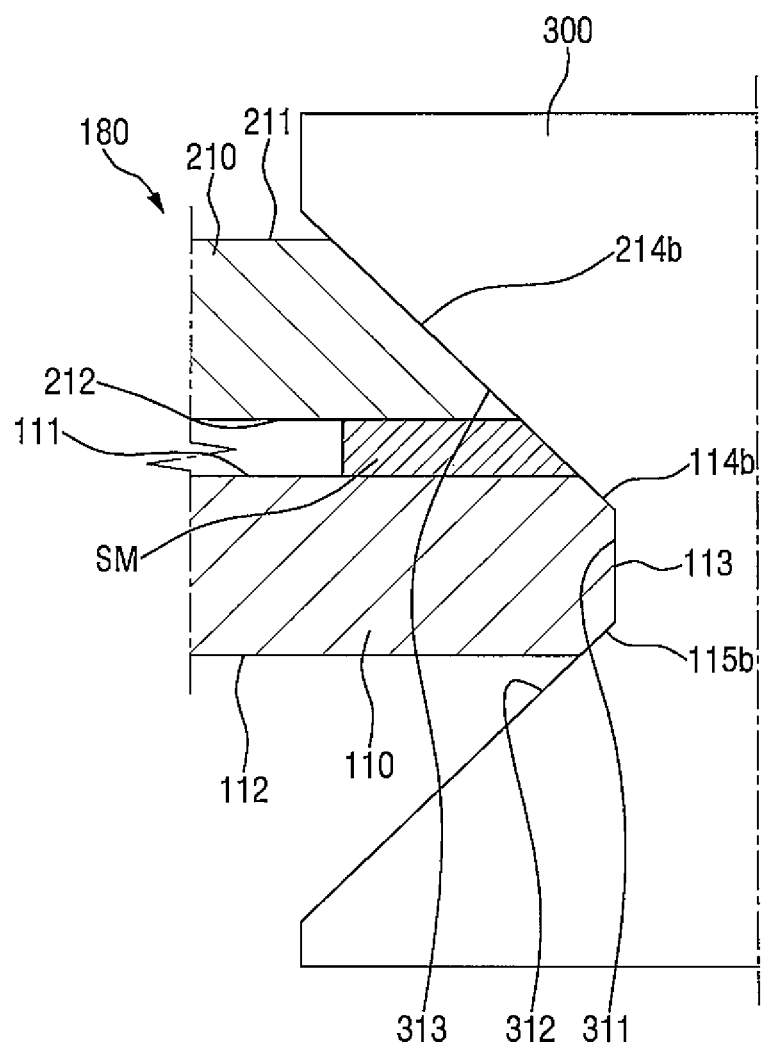

Referring to FIG. 19, inclined surfaces 114b, 115b, and 214b may be formed on the second chamfered portion 180 by polishing the second chamfered portion 180 using the polishing groove 310 of the polishing wheel 300.

Thereafter, the polishing groove 310 of the polishing wheel 300 is moved past the second chamfered portion 180 to face a first chamfered portion 170. Thereafter, the first chamfered portion 170 where inclined surfaces are yet to be formed is polished by aligning the polishing groove 310 of the polishing wheel 300 in such a manner that the center of the inner side surface 311 can coincide with the center between the first top surface 111 and the first bottom surface 112 of the first display substrate 110 when the polishing groove 310 of the polishing wheel 300 faces the second chamfered portion 180. As a result, referring to FIG. 20, inclined surfaces 114a and 115a are formed on the first chamfered portion 170.

Various exemplary polishing processes for forming chamfered portions will hereinafter be described.

FIGS. 21 through 26 are cross-sectional views illustrating various exemplary polishing processes for forming chamfered portions.

Figure 21:
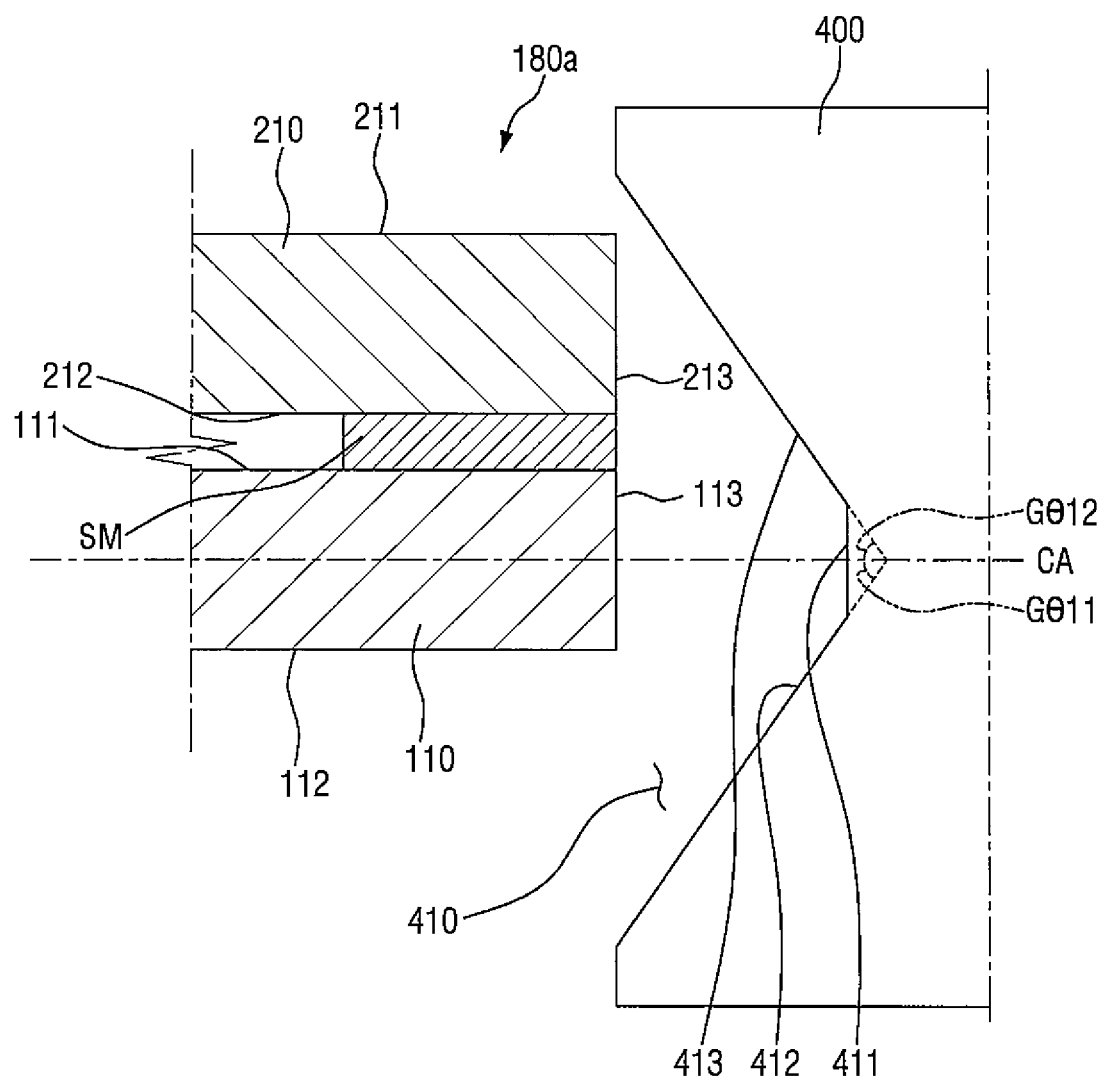
FIGS. 21 through 26 are cross-sectional views illustrating various exemplary polishing processes for forming chamfered portions.

FIG. 21 illustrates an example in which a polishing wheel 400 faces a second chamfered portion 180a on which inclined surfaces are yet to be formed.

The polishing wheel 400 is similar to the polishing wheel 300 of FIG. 18, but has a polishing groove 410 that has a different shape from the polishing groove 310 of FIG. 18.

The polishing groove 410 has an inner side surface 411, a first inner inclined surface 412, which is connected to the inner side surface 411 below the inner side surface 411, and a second inner inclined surface 413, which is connected to the inner side surface 411 above the inner side surface 411.

The polishing groove 410 of the polishing wheel 400 is aligned in such a manner that the center of the inner side surface 411 can coincide with the center between a first top surface 111 and a first bottom surface 112 of a first substrate 110 when the polishing groove 410 of the polishing wheel 400 faces the second chamfered portion 180a. A first angle G$\theta$11 that a horizontal axis CA (which is formed by the alignment of the polishing groove 410 of the polishing wheel 400) and the first inner inclined surface 412 form with each other may be the same as a second angle G$\theta$12 that the horizontal axis CA and the second inner inclined surface 413 form with each other. The first and second angles G$\theta$11 and G$\theta$12 of FIG. 21 may be greater than the first and second angles G$\theta$1 and G$\theta$2, respectively, of FIG. 18.

Figure 22:
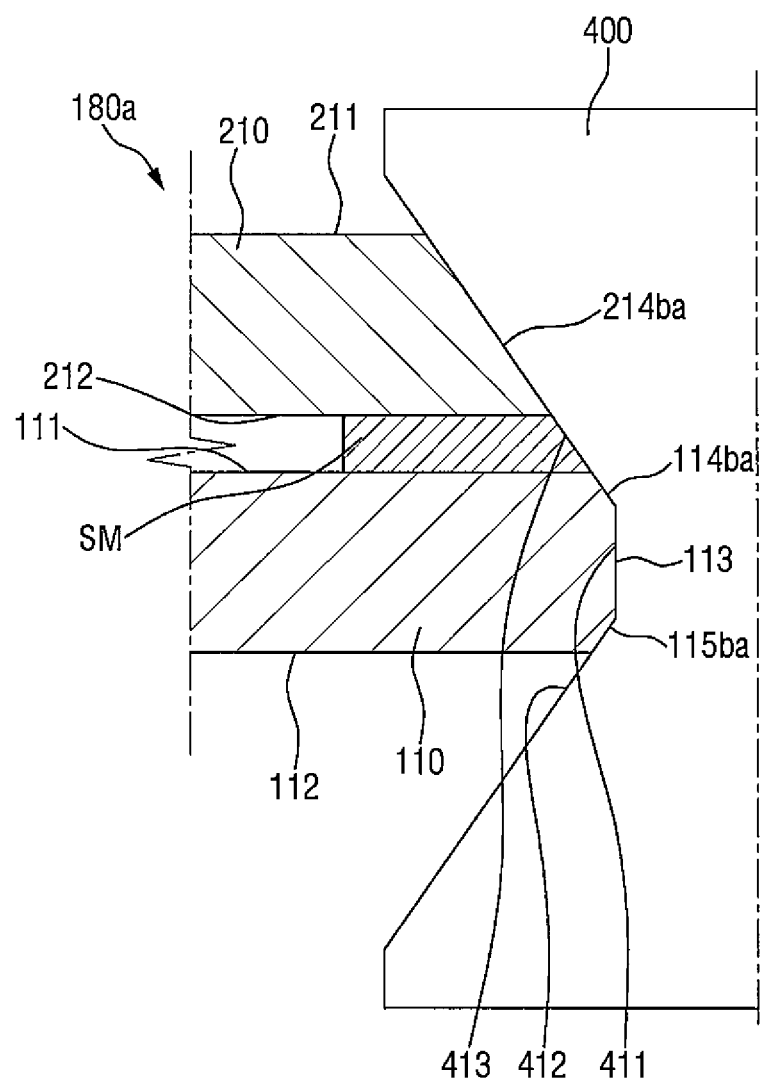

Referring to FIG. 22, inclined surfaces 114ba, 115ba, and 214ba may be formed on the second chamfered portion 180a by polishing the second chamfered portion 180a using the polishing groove 410 of the polishing wheel 400.

Figure 20:
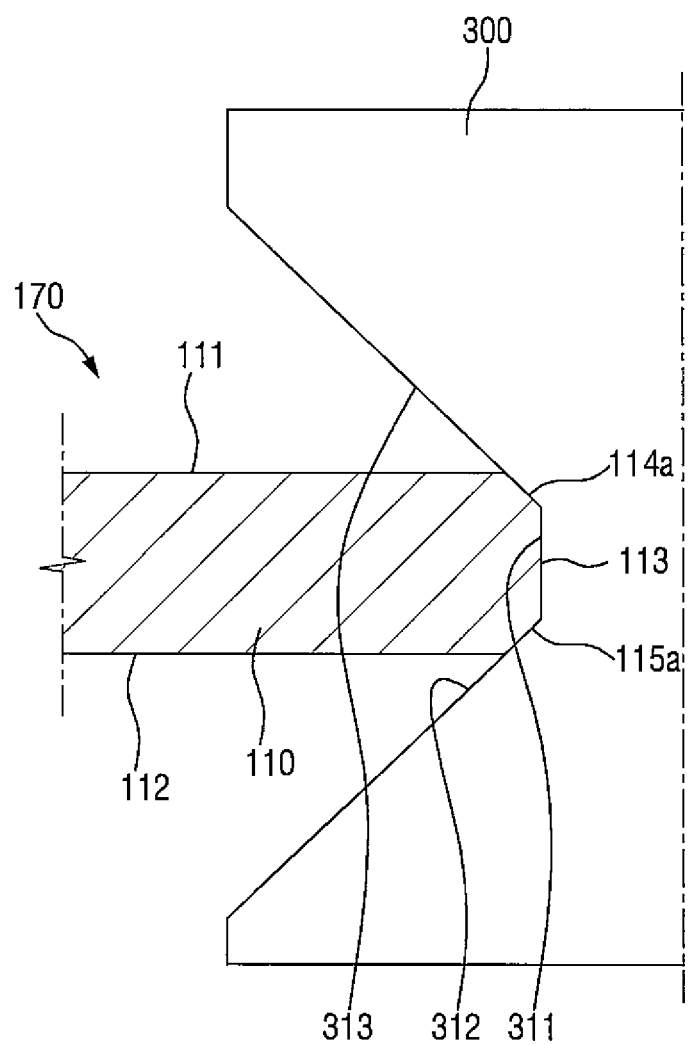

The polishing of a first chamfered portion (e.g., first chamfered portion 170a of FIG. 9), which follows the polishing of the second chamfered portion 180a, may be performed in the same manner as the polishing of the first chamfered portion 170 of FIG. 20, and thus, a repeated detailed description thereof will be omitted.

FIG. 23 illustrates an example in which a polishing wheel 500 faces a second chamfered portion 180b on which inclined surfaces are yet to be formed.

The polishing wheel 500 is similar to the polishing wheel 300 of FIG. 18, but has a polishing groove 510, which has a different shape from the polishing groove 310 of FIG. 18.

The polishing groove 510 has an inner side surface 511, a first inner inclined surface 512, which is connected to the inner side surface 511 below the inner side surface 511, and a second inner inclined surface 513, which is connected to the inner side surface 511 above the inner side surface 511.

The polishing groove 510 of the polishing wheel 500 is aligned in such a manner that the center of the inner side surface 511 can coincide with a point (e.g., the center or midpoint) between a first top surface 111 and a first bottom surface 112 of a first display substrate 110 when the polishing groove 510 of the polishing wheel 500 faces the second chamfered portion 180b. A first angle Gθ31 that a horizontal axis CA (which is formed by the alignment of the polishing groove 510 of the polishing wheel 500) and the first inner inclined surface 512 form with each other may be different from a second angle Gθ32 that the horizontal axis CA and the second inner inclined surface 513 form with each other. For example, the second angle Gθ32 may be greater than the first angle Gθ31.

Figure 24:
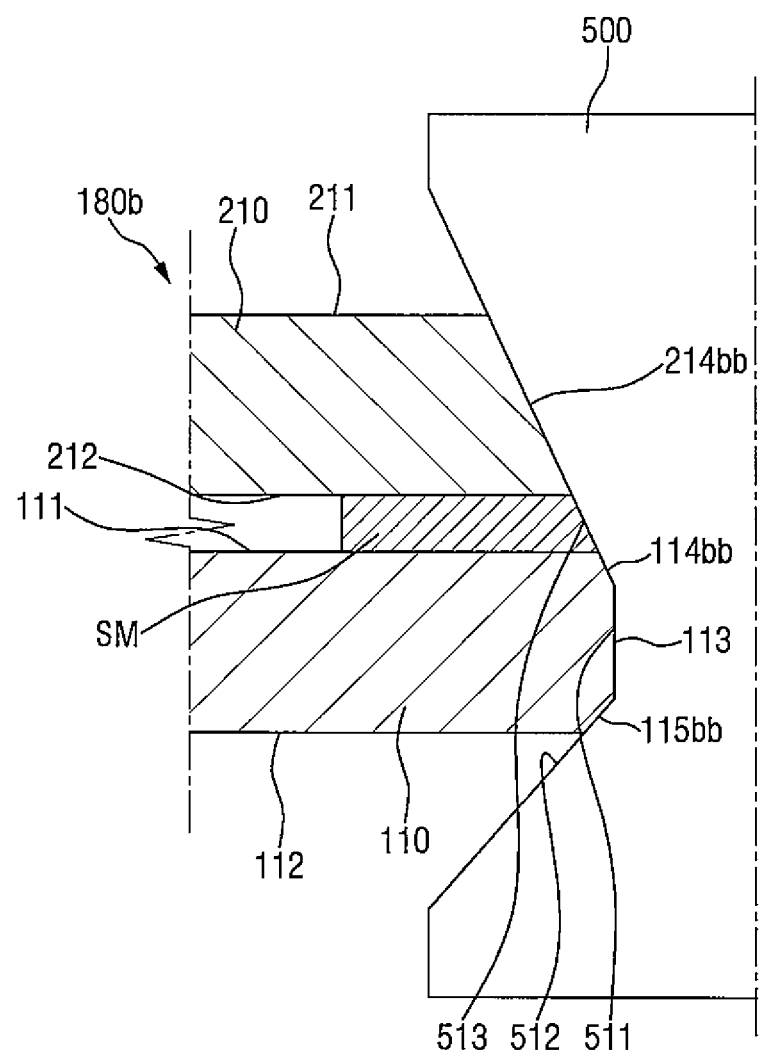

Referring to FIG. 24, inclined surfaces 114bb, 115bb, and 214bb may be formed on the second chamfered portion 180b by polishing the second chamfered portion 180b using the polishing groove 510 of the polishing wheel 500.

The polishing of a first chamfered portion (e.g., the first chamfered portion 170b of FIG. 11), which follows the polishing of the second chamfered portion 180b, may be performed in the same manner as the polishing of the first chamfered portion 170 of FIG. 20, and thus, a repeated detailed description thereof will be omitted.

FIG. 25 illustrates an example in which a polishing wheel 600 faces a second chamfered portion 180c on which inclined surfaces are yet to be formed.

The polishing wheel 600 is similar to the polishing wheel 300 of FIG. 18, but has a polishing groove 610, which has a different shape from the polishing groove 310 of FIG. 18.

The polishing groove 610 has an inner side surface 611, a first inner inclined surface 612, which is connected to the inner side surface 611 below the inner side surface 611, and a second inner inclined surface 613, which is connected to the inner side surface 611 above the inner side surface 611.

The polishing groove 610 of the polishing wheel 600 is aligned in such a manner that the center of the inner side surface 611 can generally coincide with the center between a first top surface 111 and a first bottom surface 112 of a first display substrate 110 when the polishing groove 610 of the polishing wheel 600 faces the second chamfered portion 180c. A first angle Gθ41 that a horizontal axis CA (which is formed by the alignment of the polishing groove 610 of the polishing wheel 600) and the first inner inclined surface 612 form with each other may be different from a second angle Gθ42 that the horizontal axis CA and the second inner inclined surface 613 form with each other. For example, the second angle Gθ42 may be greater than the first angle Gθ41. The second angle Gθ42 may be greater than the second angle Gθ32 of FIG. 23, and the first angle θ41 may be smaller than the first angle Gθ31 of FIG. 23.

Figure 26:
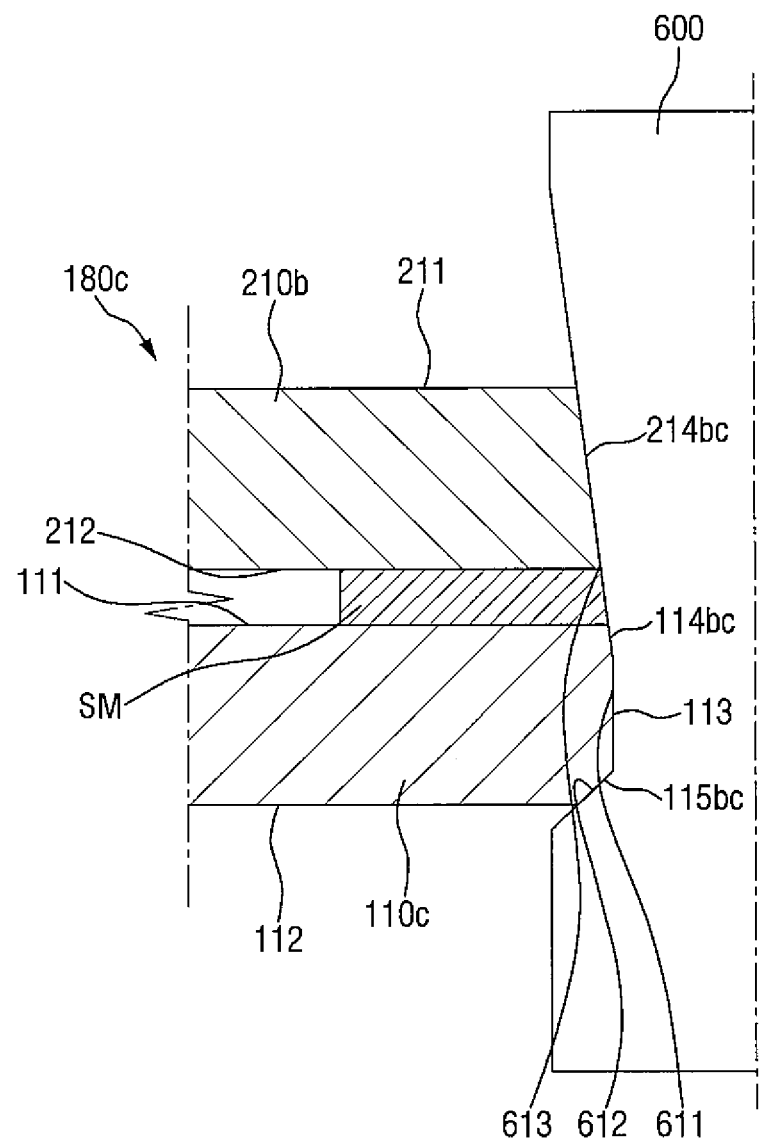

Referring to FIG. 26, inclined surfaces 114bc, 115bc, and 214bc may be formed on the second chamfered portion 180c by polishing the second chamfered portion 180c using the polishing groove 610 of the polishing wheel 600.

The polishing of a first chamfered portion (e.g., first chamfered portion 170c of FIG. 13), which follows the polishing of the second chamfered portion 180c, may be performed in substantially the same manner as the polishing of the first chamfered portion 170 of FIG. 20, and thus, a repeated detailed description thereof will be omitted.

In concluding the detailed description, those skilled in the art will appreciate that many variations and modifications can be made to the preferred embodiments without substantially departing from the principles of the present invention. Therefore, the disclosed embodiments of the invention are used in a generic and descriptive sense only and not for purposes of limitation.

What is claimed is:

1. A display device comprising:
a lower display substrate; and
an upper display substrate on the lower display substrate and overlapping the lower display substrate in a thickness direction of the display device,
wherein an overlapping region of the upper display substrate and the lower display substrate comprises at least one curved portion on a plane,
wherein the at least one curved portion comprises a first chamfered portion and a second chamfered portion spaced apart from each other,
wherein the lower display substrate comprises a first top surface, a first bottom surface opposite the first top surface, and a lower side surface positioned between the first top surface and the first bottom surface,
wherein the upper display substrate comprises a second top surface, a second bottom surface opposite the second top surface, and an upper side surface positioned between the second top surface and the second bottom surface, and
wherein the lower side surface and the upper side surface in the first chamfered portion is different from the lower side surface and the upper side surface in the second chamfered portion.

2. The display device of claim 1, wherein, in each of the first chamfered portion and the second chamfered portion, the lower side surface comprises a first lower inclined surface connected to the first bottom surface and having a different slope from the first bottom surface.

3. The display device of claim 2, wherein, in the first chamfered portion, the lower side surface comprises a first upper inclined surface connected to the first top surface and having a different slope from the first top surface.

4. The display device of claim 3, wherein, in the first chamfered portion,
the lower side surface comprises a first side surface connected to the first upper inclined surface and the first lower inclined surface, the first side surface having a different slope from the first upper inclined surface and the first lower inclined surface, and,
wherein, in the second chamfered portion,
the lower side surface comprises a first side surface connected to the first top surface and the first lower inclined surface, the first side surface having a different slope from the first top surface and the first lower inclined surface.

5. The display device of claim 4, wherein a length of the first side surface in the first chamfered portion is less than a length of the first side surface in the second chamfered portion.

6. The display device of claim 3, wherein, in each of the first chamfered portion and the second chamfered portion, the upper side surface further comprises an upper inclined surface connected to the second top surface and has a different slope from the second top surface.

7. The display device of claim 6,
wherein, in the first chamfered portion, the upper inclined surface is directly connected to the second bottom surface, and wherein, in the second chamfered portion, the upper side surface further comprises a second side surface connected to the upper inclined surface and the second bottom surface, and has a different slope from the upper inclined surface and the second bottom surface.

8. The display device of claim 7, wherein a length of the upper inclined surface in the first chamfered portion is greater than a length of the upper inclined surface in the second chamfered portion.

9. The display device of claim 6, wherein the lower display substrate further comprises a protruding region protruding from one side of the upper display substrate on a plane, and wherein, in a plan view, the first chamfered portion is positioned closer to the protruding region than the second chamfered portion.

\* \* \* \* \*